US008989829B1

(12) United States Patent
Jones, III (10) Patent No.: US 8,989,829 B1
(45) Date of Patent: *Mar. 24, 2015

(54) LAYERED SUPERCONDUCTOR DEVICE (71) Applicant: The United States of America as represented by the Secretary of the Navy, Washington, DC (US)

(72) Inventor: Thomas O. Jones, III, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/155,513

(22) Filed: Jan. 15, 2014

Related U.S. Application Data

(63) Continuation-in-part of application No. 13/438,091, filed on Apr. 3, 2012, and a continuation-in-part of application No. 13/613,244, filed on Sep. 13, 2012, now Pat. No. 8,649,834, and a continuation-in-part of application No. 12/369,218, filed on Feb. 11, 2009, now abandoned.

(51) Int. Cl.
*H01L 39/12* (2006.01)
*H01L 39/22* (2006.01)
*H01L 39/24* (2006.01)
*H01L 29/00* (2006.01)

(52) U.S. Cl.
USPC ............................ 505/191; 505/190; 505/220

(58) Field of Classification Search
CPC ......... H01L 39/22; H01L 39/24; H01L 39/10; H01L 39/128; Y10S 505/703; Y10S 505/862
USPC ......... 505/190, 191, 220, 234, 237, 703, 862; 174/125.1, 250
See application file for complete search history.

(56) References Cited

U.S. PATENT DOCUMENTS 4,954,480 A * 9/1990 Imanaka et al. ............... 505/220
8,649,834 B1 * 2/2014 Jones ........................... 505/191

* cited by examiner

*Primary Examiner* — Colleen Dunn
*Assistant Examiner* — Kallambella Vijayakumar
(74) *Attorney, Agent, or Firm* — SPAWAR Systems Center Pacific; Kyle Eppele; Stephen E. Baldwin (57) ABSTRACT

A layered superconductor device includes multiple layers of a single crystal superconducting material having intermittent layers of superconducting material dispersed in a pattern with a second material such that each layer of the multiple layers a single crystal superconducting material are interconnected via superconducting material, allowing for a continuous current path, and a thickness of the superconducting material never exceeds a first predetermined thickness.

17 Claims, 15 Drawing Sheets

LAYERED SUPERCONDUCTOR DEVICE

CROSS-REFERENCE TO RELATED APPLICATION

The present application is a continuation-in-part patent application of patent application Ser. No. 13/438,091, filed Apr. 3, 2012, entitled LAYERED SUPERCONDUCTOR DEVICE (NC 101,656), and patent application Ser. No. 13/613,244, filed Sep. 13, 2012 entitled LAYERED SUPERCONDUCTOR DEVICE AND METHOD (NC 102,062), now U.S. Pat. No. 8,649,834, which is a continuation of now abandoned patent application Ser. No. 12/369,218, filed Feb. 11, 2009, entitled LAYERED SUPERCONDUCTOR DEVICE AND METHOD (NC 098,106-hereinafter "the parent application"), all assigned to the same assignee as the present application, the details of which are hereby incorporated by reference. Priority is claimed under 35 USC 120 for all common subject matter.

FEDERALLY-SPONSORED RESEARCH AND DEVELOPMENT

This invention (Navy Case No. 102,955) is assigned to the United States Government and is available for licensing for commercial purposes. Licensing and technical inquires may be directed to the Office of Research and Technical Applications, Space and Naval Warfare Systems Center, Pacific, Code 72120, San Diego, Calif. 92152; voice (619) 553-2778; email T2@spawar.navy.mil.

BACKGROUND OF THE INVENTION

Since their discovery, high-temperature superconductors have found a variety of uses in industry. Unfortunately, some high-temperature superconducting materials suffer a number of shortfalls including a limited maximum current capacity, super-conductivity must be limited to a particular direction relative to the crystalline structure of the superconducting material and such crystalline structures tend to lose orientation when grown beyond a thickness $\Delta_c$.

A possible approach to realigning crystal orientation of bulk superconducting devices has been to disperse thin layers of a substrate between layers of the superconducting material in a manner that looks like a layer cake. In such formations, each layer of superconducting material may act as an independent device.

SUMMARY OF THE INVENTION

In one preferred embodiment, the superconductor device comprises a first type of single crystal superconductor material layer; a second type of a layer having an intermittent patterned layer of single crystal superconductor material dispersed with a second material; and a third type of a layer having a complementary intermittent patterned layer of single crystal superconductor material dispersed with the second material where the complementary patterned layer is offset relative to the second patterned layer wherein one of the first, second or third layers is formed on a base substrate. First and second insulation layers form insulation sides on the outside edges of the first, second and third layers. The first, second and third layers are arranged in multiple layers where multiple ones of the first layers are alternately dispersed between the second layers and the third layers to form a layered superconductor device having respective pairs of the second layers and the third layers dispersed apart from one another and where the respective distance between each pair of the second layers and each pair of the third layers never exceeds a first predetermined thickness in which the superconducting material loses crystal orientation and where each layer of the single crystal superconducting material is interconnected via superconducting material to allow a continuous current path through all of the multiple layers.

BRIEF DESCRIPTION OF THE DRAWINGS

The accompanying drawings incorporated in and forming a part of the specification illustrate several aspects of the present invention and, together with the description, serve to explain the principles of the invention. In the drawings, where like numerals represent like components:

FIGS. 8-15 show several possible configurations of the edge of a superconductor, where:

DETAILED DESCRIPTION OF THE EMBODIMENTS

The disclosed methods and systems below may be described generally, as well as in terms of specific examples and/or specific embodiments. For instances where references are made to detailed examples and/or embodiments, it should be appreciated that any of the underlying principals described are not to be limited to a single embodiment, but may be expanded for use with any of the other methods and systems described herein as will be understood by one of ordinary skill in the art unless otherwise stated specifically.

Figure 1:
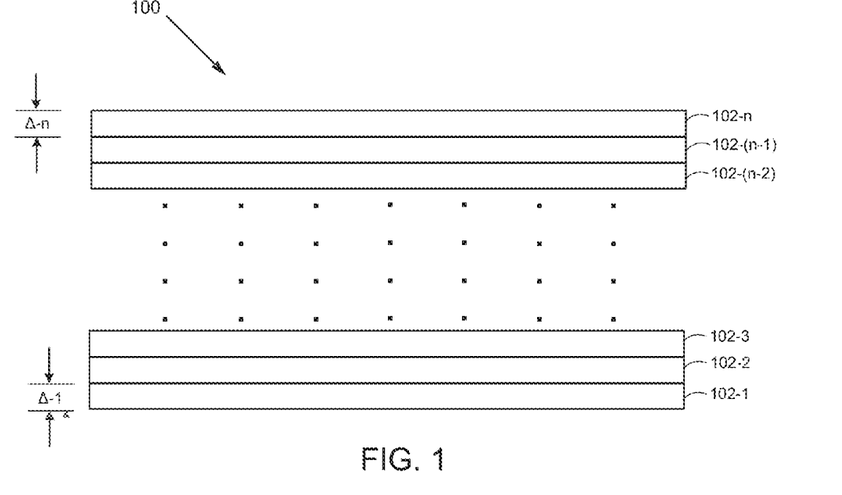
FIG. 1 is a side-view of the layers of an exemplary superconducting device.

FIG. 1 is a side-view of the layers 102-1 ... 102-n of an exemplary superconducting device 100. As shown in FIG. 1, the various layers 102-1 ... 102-n can make physical contact with one another, and each of the layers 102-1 ... 102-n can have a respective thickness $\Delta$-1 ... $\Delta$-n. While in various embodiments it is envisioned that each layer's thickness $\Delta$-1 ... $\Delta$-n can be relatively constant, it should also be appreciated that relative layer thicknesses may vary as will be discussed further below. Further, it may be appreciated that patterned layers may be made substantially thinner than layers of superconductor, or conversely make patterned layers may be made substantially thicker than layers of superconductor. Also, a thickness of any type layer may vary to a very small (e.g., a few nanometers) dimension.

Figure 2:
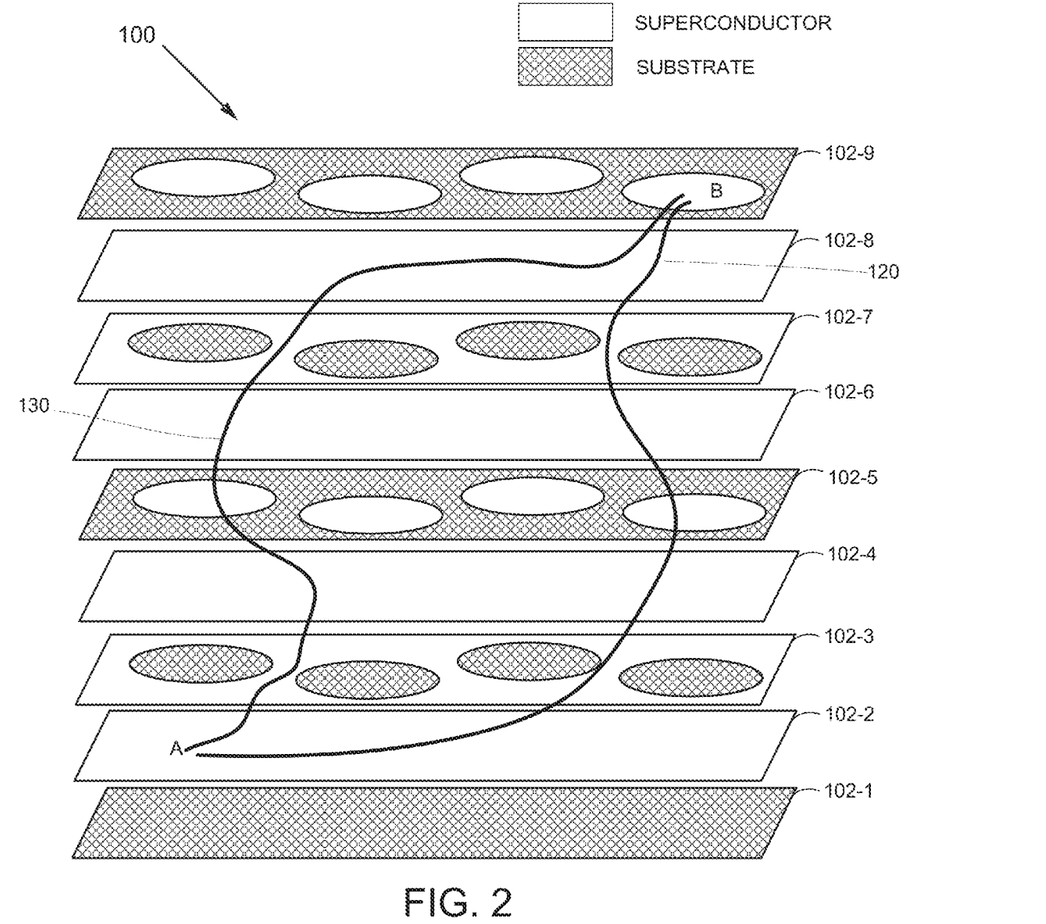
FIG. 2 is an exploded view of the layers of an exemplary superconducting device.

FIG. 2 is an exploded view of the layers of an exemplary superconductor device. As shown in FIG. 2, the various layers 102-1 . . . 102-n can be dispersed according to a particular order of substrate 102-1, superconductor layer 102-2, first patterned layer 102-3, superconductor layer 102-4, second patterned layer 102-5, superconductor layer 102-6, and so on.

Note that the exemplary patterns of the first patterned layer 102-3 (and 102-7) and the second patterned complement layer 102-5 (and 102-9) use patterns of circles dispersed with a second material, e.g., a semiconductor substrate material or a metal, such that the superconductor material portion of the patterned layers could be, for example, somewhere between 30%-70%, and in some embodiments about 50% for each patterned layer.

Also note that while the example of FIG. 2 uses patterns of circles (shown in perspective view in FIG. 2 as oval shape), in various alternatives any other combination of patterns may be used, such as patterns of parallel bars oriented along the direction of desired current flow (which can be a function of crystal orientation), parallel bars oriented perpendicular or parallel to direction of desired current flow, patterns of squares, and so on as may be found advantageous or otherwise suitable from embodiment to embodiment.

As seen in FIG. 2, the superconductor device 100 can provide for alternate continuous current paths 120 or 130 throughout all of the multiple layers 102, from point A to point B.

Figure 3:
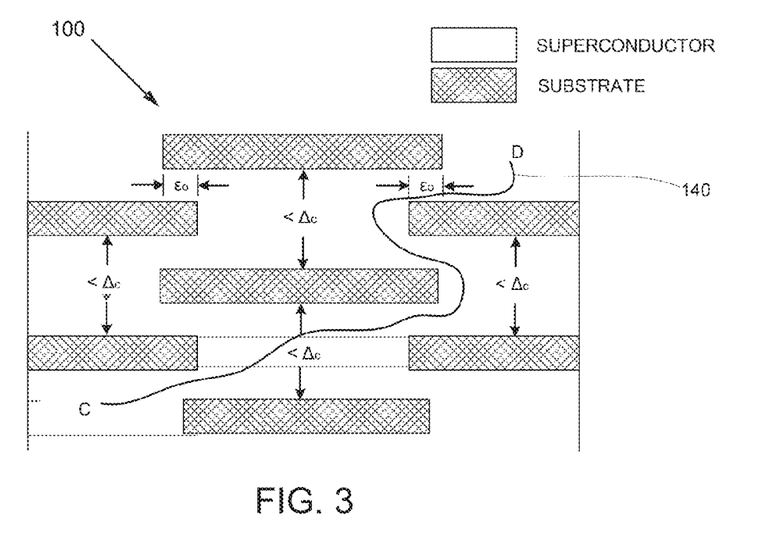
FIG. 3 is a side-view of the layers of an exemplary superconducting device depicting relative geometric relationships.

FIG. 3 is another side-view of a portion of the exemplary superconducting device 100 depicting relative geometric relationships. As shown in FIG. 3, the exemplary superconducting device 100 includes layers of superconducting material dispersed between patterned layers of superconducting material and a second material, which for the present example could be a magnesium oxide (MgO) substrate. The superconductor material could be a high-temperature superconductor (e.g., >30K) such as bismuth-strontium-calcium-copper-oxide (BSCCO) or yttrium-barium-copper-oxide (YBCO).

Note that the thickness of the superconducting material in FIG. 3 never exceeds $\Delta_c$, which for the present example represents a thickness in which the superconducting material loses crystal orientation. Also note that while the exemplary superconducting device 100 has layers of superconducting material and patterned layers of the same general thickness (each approximating one-third of the predetermined thickness in FIG. 3), it should be appreciated that, in various embodiments, it may be advantageous to minimize the thickness of patterned layers so as to increase the amount of superconducting material relative to the second (substrate) material.

Also note that, in various embodiments, it may be beneficial to allow the second material to overlap by some length $\epsilon_o$ depending on the properties of the superconducting material, while in other embodiments no overlap may be desirable. The cross-sectional areas of the patterned layers shown in FIG. 3 are generally rectangular in shape. The general cross-sectional shape could be otherwise, such as trapezoidal, elliptical, or the like.

Figure 4:
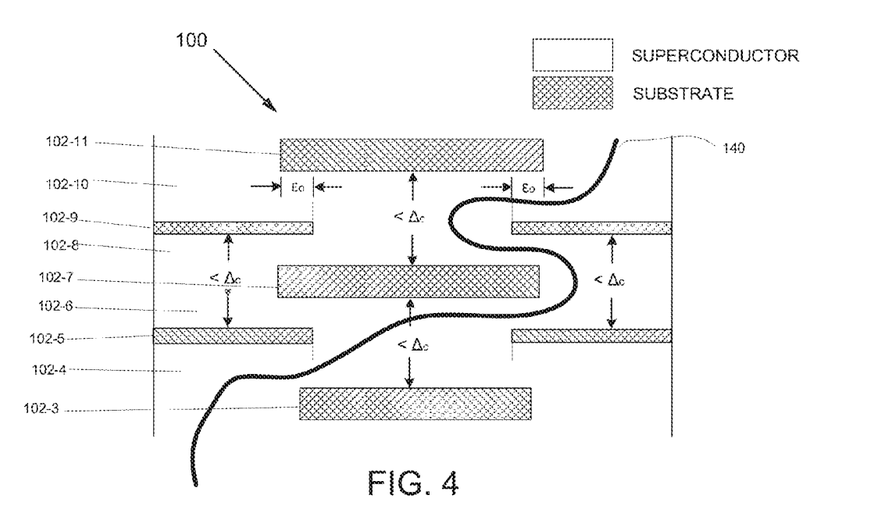
FIG. 4 is another side-view of the layers of an exemplary superconducting device depicting relative geometric relationships.

FIG. 4 shows another view of the superconductor device 100, in which the pattered layers have different depths, while the overall thickness is maintained below the thickness in which the superconductor material might start to lose single crystal orientation. In FIG. 4, the continuous current path 140 through the multiple layers 102 is seen, where the different pattered layers can have different depth dimensions. The patterned layers 102-3, 102-7, and 102-11 differ in depth from patterned layers 102-5 and 102-9.

The dimension $\Delta_c$ is always maintained less than or below the depth in which the superconductor material starts to lose single crystal orientation, so as to maintain single crystal orientation throughout the layered device 100. For instance, it can be seen that the total distance of the gap from the bottom of patterned layer 102-11 to the top of patterned layer 107-7 in FIG. 4 is less than the dimension $\Delta_c$. Similarly, the total distance between the bottom of layer 102-9, layer 102-8, layer 102-7, layer 102-6 and the top of layer 102-5 is also less than the depth or dimension $\Delta_c$, as shown in FIG. 4.

The arrangement of the superconductor layers and gaps between the patterned layers shown in FIGS. 2-4 maintains a constant single crystal orientation throughout the device 100, allowing for a continuous current path through each of the layers 102 shown in FIGS. 3-4. Note the continuous current path 140 throughout the multiple layers 102 of the device 100, from point C to point D, while maintaining the constant single crystal orientation (never exceeding the dimension $\Delta_c$).

Figure 5:
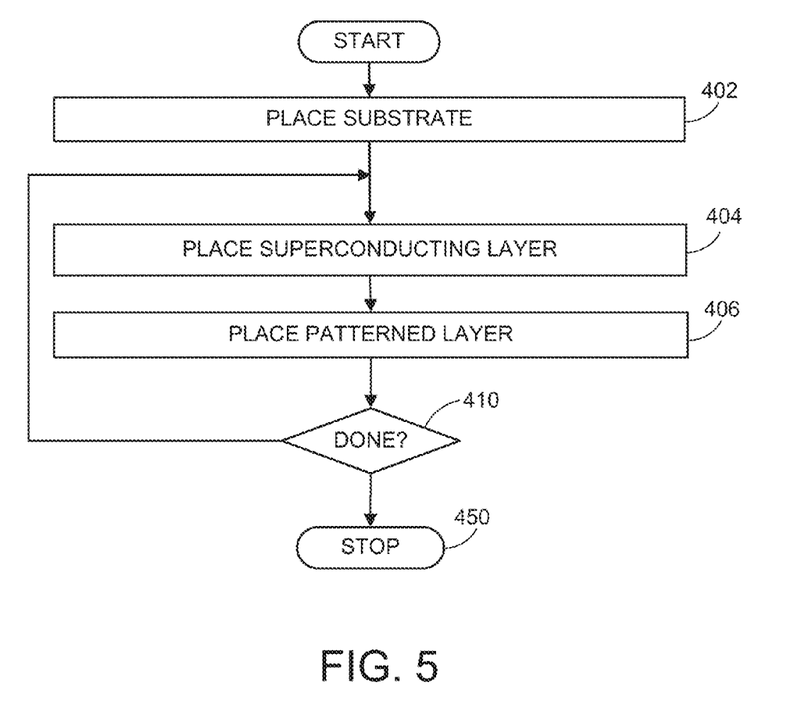
FIG. 5 is a flowchart outlining an exemplary operation of the disclosed methods and systems.

FIG. 5 is a flowchart outlining an exemplary operation of the disclosed methods and systems. The process starts in step 402 where a substrate is provided. Next, in step 404, a layer of superconductor is placed/grown upon the substrate, and then in step 406 a patterned layer is placed/grown upon the superconducting layer. Control continues to step 410.

In step 410, a determination is made as to whether the process of building the overall superconductor device is done. If the process is done, control continues to step 450 there the process stops; otherwise, control jumps back to step 404 where another superconductor layer and another patterned layer are respectively placed/grown noting that it can be beneficial to allow patterned layers to compliment one another in the manner shown in FIGS. 2-4 such that the superconducting material never exceeds a vertical thickness in which the superconducting material loses crystal orientation.

Figure 6:
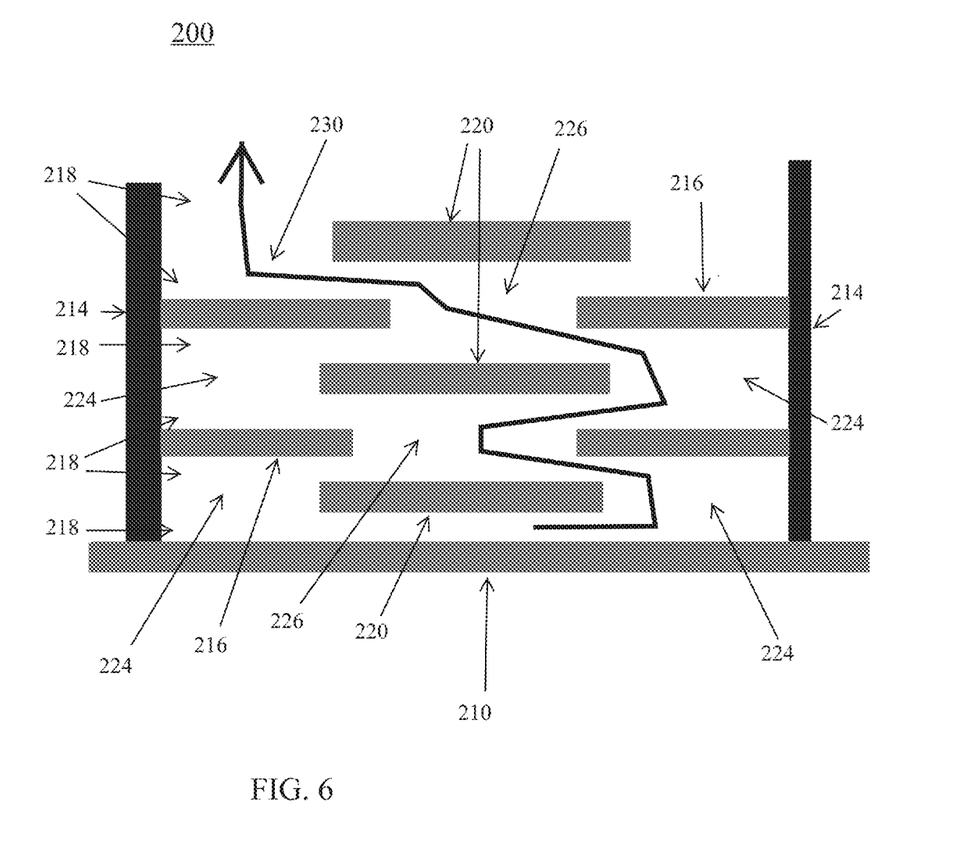
FIG. 6 is an embodiment of a superconductor device which can act as a conducting wire in an integrated circuit.

FIG. 6 shows another embodiment of a layer superconductor device 200. In prior embodiments described above, the structure generally extends across the entire superconductor (see FIGS. 1-4).

Superconductors can be used as connectors in circuits. One such application is high performance filters. Such filters have very sharp band pass or very sharp stop band. In existing filter designs, the performance is limited by the current capacity of the superconductor.

FIG. 6 shows how an initial layer of superconductor can be improved by adding layers of (patterned substrate and superconductor), superconductor and complementary patterned substrate and superconductor. The concept is the same as before except the layered superconductor is a finite wire in a circuit. The edge treatment the layered superconductor is not critical to the performance; the edge treatment is determined by other considerations.

In FIG. 6, the superconductor device 200 has superconductor layers enclosed in a channel with insulators 214 on either end of device 200 (left and right portions of FIG. 6). The first superconductor layers 218 alternate between first patterned layers 216 and second complementary patterned layers 220. The substrate 210 forms a base for the device 200 in which layer 200 is formed on substrate 210.

It can be seen in FIG. 6 that the patterned layers 216 and complementary patterned layers 220 have substrate material that are complementary offset with each other, forming alternating regions 224 on the right and left edge portions of device 200 and regions 226 in the center portion of device 200. In some embodiments, end portions of the offset patterns can slightly overlap each other, as also shown in FIG. 6, similar to the offset $\epsilon_o$ shown in FIGS. 3-4.

The depth of the respective alternating regions 224, 226 shown in FIG. 6 is never more than the dimension $\Delta_c$, as previously described in conjunction with FIGS. 2-4. As a result, single crystal orientation is always maintained throughout device 200, which allows for the continuous current path 230 shown in FIG. 6, similar to the current paths described previously in conjunction with FIGS. 2-4.

Figure 7:
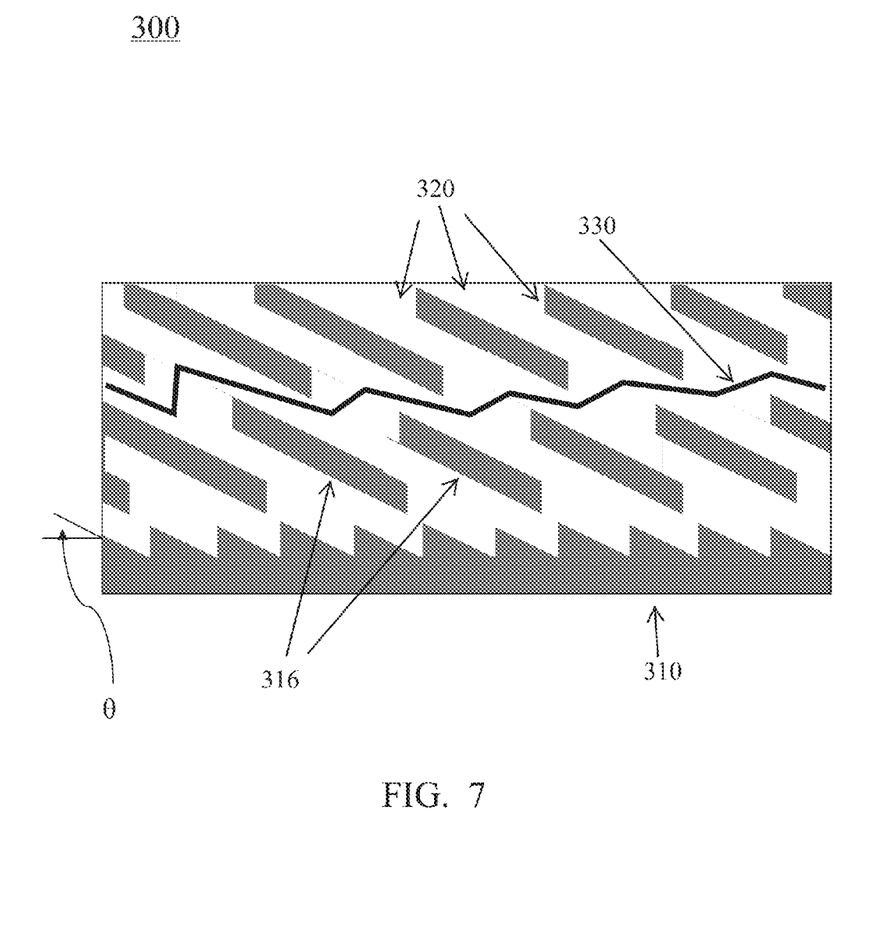
FIG. 7 is an embodiment of a superconductor device with a slanted design.

FIG. 7 shows a slanted configuration of a superconductor device 300, in which the layers are grown at an angle θ. This slanted configuration shown in FIG. 7 is in contrast with the parallel alignment configurations shown in FIGS. 2-4 and 6. There are many possible variations of a slanted configuration.

In FIG. 7, the substrate base 310 and substrate layers 316 are oriented with the crystal axis at an angle relative to horizontal. The substrate base 310 is prepared with a saw tooth pattern, as shown in FIG. 7. The superconductor layers are designated by numeral 320. A continuous current path 330 is shown in FIG. 7, in accordance with prior embodiments shown in FIGS. 2-4 and 6.

In FIG. 7, each flat spot would allow the superconductor to grow with the superconductor high current mode at angle θ. The layers would be applied as shown but with the same angle relative to the substrate. This type of layering could be utilized for a non-planar geometry, such as the surface of a cylinder or spheres.

Figure 8:
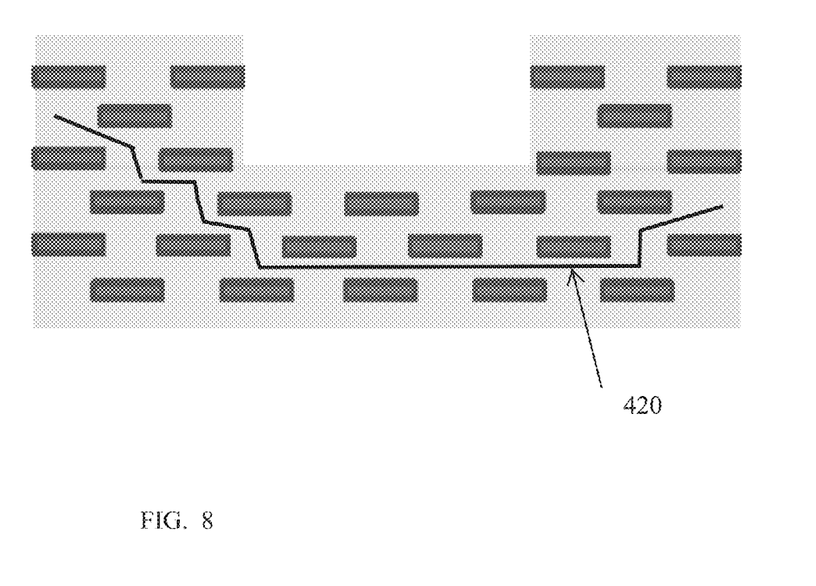
FIG. 8 shows a wider edge shape.
Figure 9:
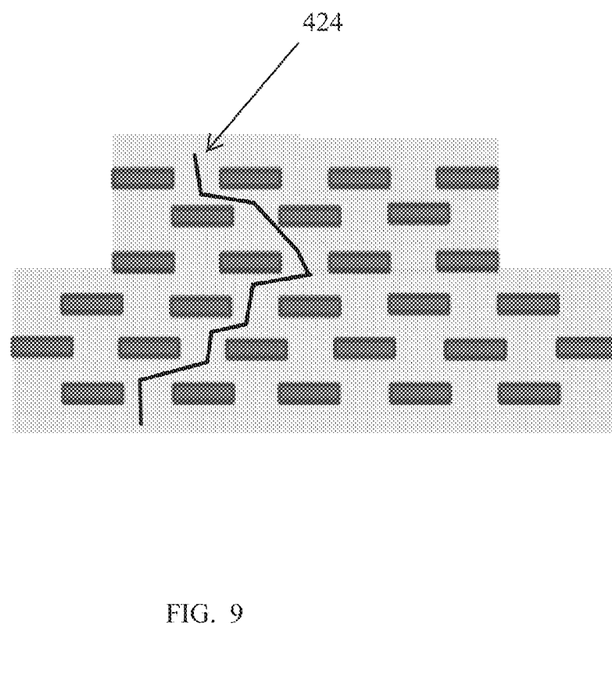
FIG. 9 shows a large step shape.
Figure 10:
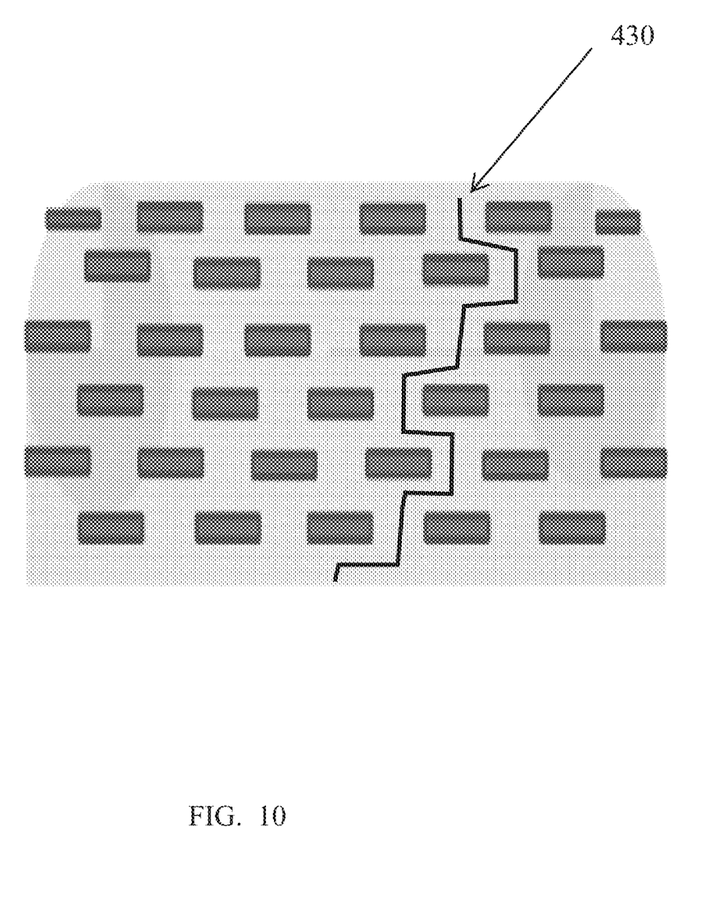
FIG. 10 shows a round edge shape.
Figure 11:
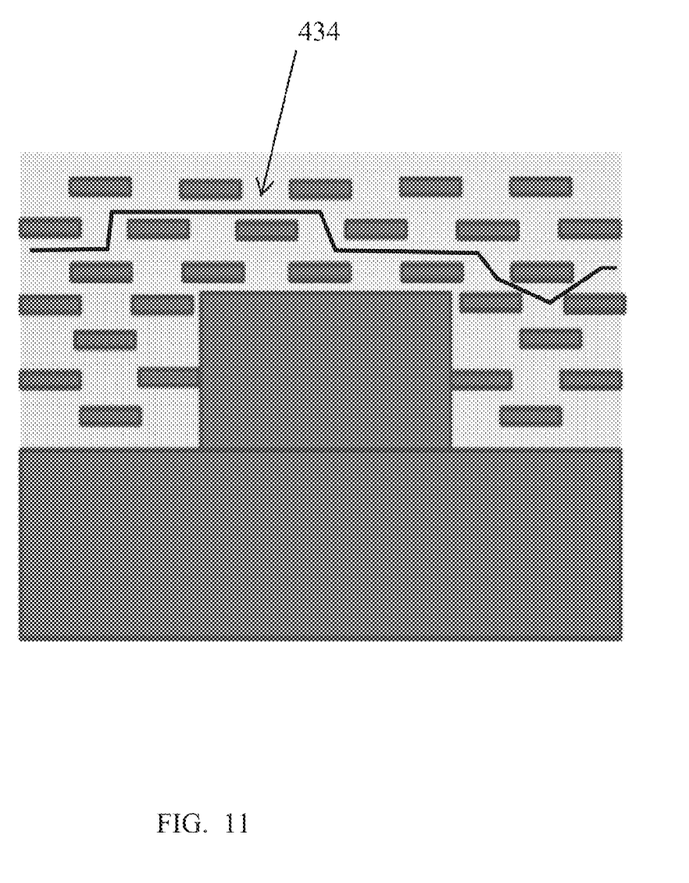
FIG. 11 shows a raised substrate shape.
Figure 12:
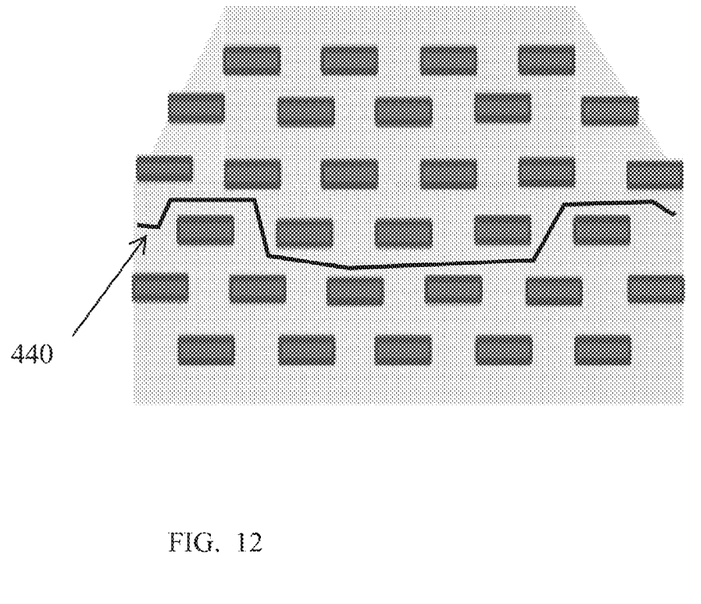
FIG. 12 shows a triangular edge shape.
Figure 13:
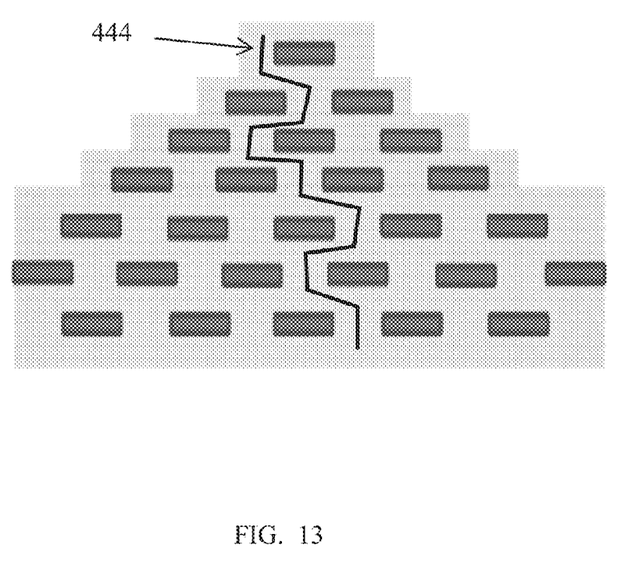
FIG. 13 shows a small step shape.
Figure 14:
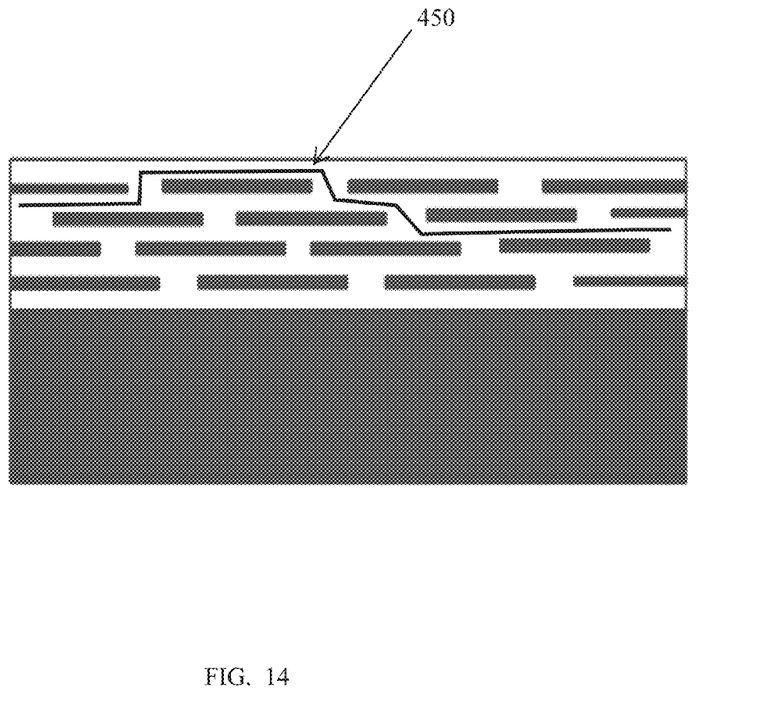
FIGS. 14 and 15 show non-uniform patterns.
Figure 15:
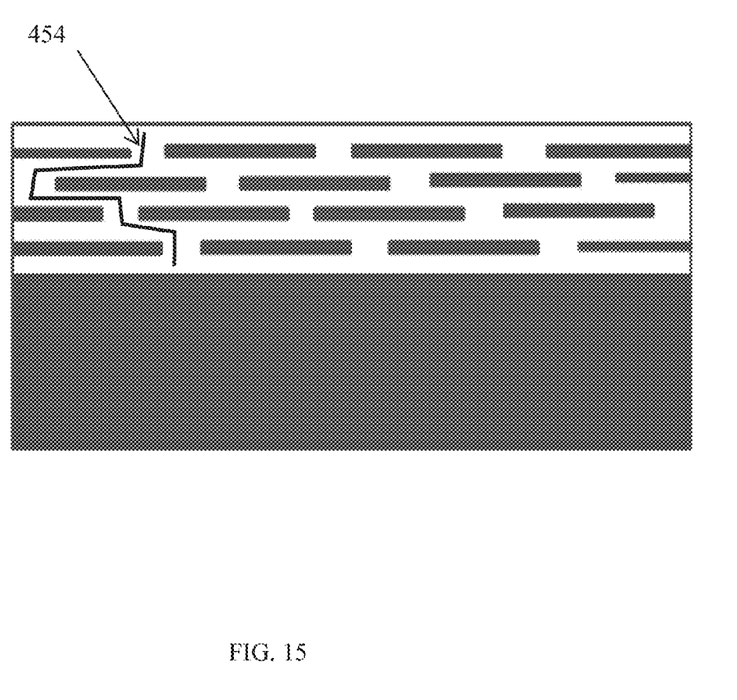

FIGS. 8-15 show several possible configurations of the edges of a superconductor device, where:

FIG. 8 shows a wider edge formed shape having a generally horizontal current path 420;

FIG. 9 shows a large step formed shape having a generally vertical current path 424;

FIG. 10 shows a round edge formed shape having a vertical current path 428;

FIG. 11 shows a raised substrate formed shape having a generally horizontal current path 434;

FIG. 12 shows a triangular edge formed shape having a generally horizontal current path 440;

FIG. 13 shows a small step formed shape having a generally vertical current path 448;

FIG. 14 shows a non-uniform pattern formed shape having a generally horizontal current path 450;

FIG. 15 shows a non-uniform pattern formed shape having a generally vertical current path 454.

The current distribution on a RF superconductor device may not be uniform. Current typically concentrates at the edge of the superconductor with less in the center.

In addition, current flow in a RF superconductor can allow the current in the interior. In this case the magnetic flux penetrates the superconductor. Changing the cross section of the superconductor wire could improve the uniformity of the current distribution.

Current distribution can be based on non-linear effects. Nonlinear processes depend on the square of the current density, which is impacted by the wire shape.

FIGS. 8-13 show illustrative superconductor current paths, where FIG. 8 shows a wider edge shape; FIG. 9 shows a large step shape; FIG. 10 shows a round edge shape; FIG. 11 shows a raised substrate shape; FIG. 12 shows a triangular edge shape; and FIG. 13 shows a small step shape. Other possibilities of current paths through a superconductor are possible.

For example, although the patterns in FIGS. 8-13 show have a fixed or precise alignment, the patterns can be shifted, such as shown in FIGS. 14-15.

FIGS. 14-15 show a non-uniform pattern of the layers or stripes. The layers (viewed from end) can be shifted horizontally. The shift never allows the superconductor to be higher than the predetermined thickness of the high temperature superconductor. The size of the holes in the pattern can be adjusted to match the alignment error in the pattern. This is true for all patterns.

In some embodiments, the patterned layers may have random or nearly random pattern with holes (circles, squares etc.). The probability of small holes overlapping is small. If a small percentage of holes are partially aligned, this does not impact the other holes that are not aligned. In general, a misalignment of the different pattern layers will only impact the performance in the local region.

The current flow 450 in FIG. 14 is shown as generally horizontal and the current flow 454 in FIG. 15 is shown as generally vertical.

From the above description, it is apparent that various techniques may be used for implementing the concepts of the present invention without departing from its scope. The described embodiments are to be considered in all respects as illustrative and not restrictive. It should also be understood that the present invention is not limited to the particular embodiments described herein, but is capable of many embodiments without departing from the scope of the claims.

What is claimed is:

1. A superconductor device comprising:
    a first single crystal superconductor material layer;
    a second layer having an intermittent patterned layer of single crystal superconductor material dispersed with a second material;
    a third layer having a complementary intermittent patterned layer of single crystal superconductor material dispersed with the second material where the complementary patterned layer is offset relative to the second patterned layer;
    the first, second and third layers arranged in multiple layers having multiple layer edges where multiple ones of the first layers are alternately dispersed between the second layers and the third layers to form a layered superconductor device having respective pairs of the second layers and the third layers dispersed apart from one another and where the respective distance between each pair of the second layers and each pair of the third layers never exceeds a first predetermined thickness in which the superconducting material loses crystal orientation so as to always maintain single crystal orientation throughout the device and where each layer of the single crystal superconducting material is interconnected via superconducting material to allow a continuous current path through all of the multiple layers.

2. The device of claim 1 where the multiple layer edges have a wider edge formed shape.

3. The device of claim 1 where the multiple layer edges have a large step formed shape.

4. The device of claim 1 where the multiple layer edges have a round edge formed shape.

5. The device of claim 1 where the multiple layer edges have a raised substrate formed shape.

6. The device of claim 1 where the multiple layer edges have a triangular edge formed shape.

7. The device of claim 1 where the multiple layer edges have a small step formed shape.

8. The device of claim 1 where the multiple layer edges have a non-uniform pattern formed shape.

9. A superconductor device comprising:
    a base substrate;
    a first single crystal superconductor material layer;
    a second layer having an intermittent patterned layer of single crystal superconductor material dispersed with a second material;

a third layer having a complementary intermittent patterned layer of single crystal superconductor material dispersed with the second material where the complementary patterned layer is offset relative to the second patterned layer wherein one of the first, second or third layers is formed on the base substrate;

the first, second and third layers arranged in multiple layers having multiple layer edges where multiple ones of the first layers are alternately dispersed between the second layers and the third layers to form a layered superconductor device having respective pairs of the second layers and the third layers dispersed apart from one another and where the respective distance between each pair of the second layers and each pair of the third layers never exceeds a first predetermined thickness in which the superconducting material loses crystal orientation and where each layer of the single crystal superconducting material is interconnected via superconducting material to allow a continuous current path through all of the multiple layers and where the multiple layer edges have a shape formed from a group of a wider edge formed shape, a large step formed shape, a round edge formed shape, a raised substrate formed shape, a triangular edge formed shape, a small step formed shape, or a non-uniform pattern formed shape.

10. A superconductor device, comprising:

a base substrate;

multiple layers of a single crystal superconducting material disposed between alternating intermittent patterned layers of the single crystal superconducting material dispersed with a second material to form alternating regions of single crystal superconducting material such that each layer of the single crystal superconducting material is interconnected via superconducting material to allow at least one continuous current path through all the interconnected layers where the multiple layers have multiple layer edges and wherein the thickness of each region never exceeds a thickness in which the superconducting material loses crystal orientation so as to always maintain single crystal orientation throughout the continuous current path of the multiple layers of the superconductor device;

first and second insulation layers forming insulation sides on the outside edges of the multiple layers; and wherein one of the multiple layers is formed on the base substrate.

11. The device of claim 10 where the multiple layer edges have a wider edge formed shape.

12. The device of claim 10 where the multiple layer edges have a large step formed shape.

13. The device of claim 10 where the multiple layer edges have a round edge formed shape.

14. The device of claim 10 where the multiple layer edges have a raised substrate formed shape.

15. The device of claim 10 where the multiple layer edges have a triangular edge formed shape.

16. The device of claim 10 where the multiple layer edges have a small step formed shape.

17. The device of claim 10 where the multiple layer edges have a non-uniform pattern formed shape.

* * * * *